United States Patent
Kobayashi et al.

(10) Patent No.: US 10,000,849 B2
(45) Date of Patent: Jun. 19, 2018

(54) LAMINATE, PACKAGING MATERIAL USING THE SAME AND PRODUCTION PROCESS FOR THE SAME

(71) Applicant: MITSUI CHEMICALS, INC., Tokyo (JP)

(72) Inventors: Kyoko Kobayashi, Chiba (JP); Yuji Sawada, Ichikawa (JP); Hiroshi Hoya, Düsseldorf (DE)

(73) Assignee: MITSUI CHEMICALS, INC., Tokyo (JP)

( * ) Notice: Subject to any disclaimer, the term of this patent is extended or adjusted under 35 U.S.C. 154(b) by 201 days.

(21) Appl. No.: 15/101,805

(22) PCT Filed: Dec. 2, 2014

(86) PCT No.: PCT/JP2014/081875
§ 371 (c)(1),
(2) Date: Jun. 3, 2016

(87) PCT Pub. No.: WO2015/083702
PCT Pub. Date: Jun. 11, 2015

(65) Prior Publication Data
US 2016/0369401 A1  Dec. 22, 2016

(30) Foreign Application Priority Data
Dec. 6, 2013  (JP) .................................. 2013-253235

(51) Int. Cl.
| | | |
|---|---|---|
| B32B 27/08 | (2006.01) | |
| C23C 16/50 | (2006.01) | |
| C23C 14/20 | (2006.01) | |
| C23C 14/24 | (2006.01) | |
| B32B 15/085 | (2006.01) | |
| B32B 15/20 | (2006.01) | |
| B32B 27/18 | (2006.01) | |
| B32B 27/32 | (2006.01) | |

(52) U.S. Cl.
CPC ............ *C23C 16/50* (2013.01); *B32B 15/085* (2013.01); *B32B 15/20* (2013.01); *B32B 27/08* (2013.01); *B32B 27/18* (2013.01); *B32B 27/32* (2013.01); *C23C 14/20* (2013.01); *C23C 14/24* (2013.01); *B32B 2255/10* (2013.01); *B32B 2255/20* (2013.01); *B32B 2255/205* (2013.01); *B32B 2270/00* (2013.01); *B32B 2307/30* (2013.01); *B32B 2307/31* (2013.01); *B32B 2307/406* (2013.01); *B32B 2307/409* (2013.01); *B32B 2307/412* (2013.01); *B32B 2307/7244* (2013.01); *B32B 2307/7246* (2013.01); *B32B 2439/46* (2013.01); *B32B 2439/70* (2013.01); *B32B 2439/80* (2013.01); *B32B 2597/00* (2013.01)

(58) Field of Classification Search
CPC ......... C23C 14/20; C23C 14/24; C23C 16/50; B32B 15/085; B32B 15/20; B32B 27/08; B32B 27/18; B32B 27/32; B32B 2307/409; B32B 2307/30; B32B 2307/31; B32B 2307/406; B32B 2307/412; B32B 2307/7244; B32B 2307/7246; B32B 2255/20; B32B 2255/205; B32B 2270/00; B32B 2439/46; B32B 2439/70; B32B 2439/80; B32B 2597/00
USPC ........................................................ 428/526
See application file for complete search history.

(56) References Cited

U.S. PATENT DOCUMENTS

| | | | |
|---|---|---|---|
| 6,190,760 B1 | 2/2001 | Nagai et al. | |
| 6,503,635 B1 * | 1/2003 | Kong | B32B 27/32 428/461 |
| 6,524,719 B1 | 2/2003 | Yamane et al. | |
| 2001/0036551 A1 | 11/2001 | Yamane et al. | |
| 2010/0173168 A1 | 7/2010 | Yasui et al. | |

(Continued)

FOREIGN PATENT DOCUMENTS

| | | |
|---|---|---|
| CN | 1319048 A | 10/2001 |
| CN | 101466808 A | 6/2009 |

(Continued)

OTHER PUBLICATIONS

International Search Report for PCT/JP2014/081875 dated Mar. 10, 2015.
Office Action dated Apr. 21, 2017 in Chinese Patent Application No. 201480066569.6.
Taiwanese Patent Office, "Office Action," issued in connection with Taiwanese Patent Application No. 103142347, dated May 7, 2018.

*Primary Examiner* — William K Cheung
(74) *Attorney, Agent, or Firm* — Foley & Lardner LLP

(57) ABSTRACT

The present invention addresses the problem of providing a laminate having sufficient delamination prevention performance and simultaneously having an inorganic layer surface imparted with brightness. The laminate of the present invention is a laminate having a polyolefin-based resin layer, a layer for deposition and an inorganic layer in this order, wherein the layer for deposition includes a composition (P) for a layer for deposition and polypropylene (D), the composition (P) for a layer for deposition is obtained by melt-kneading 30 to 85% by weight of isotactic polypropylene (A) and 70 to 15% by weight of a propylene-based copolymer (B), a part or all of the isotactic polypropylene (A) and/or the propylene-based copolymer (B) has been graft-modified with a graft monomer (C), and the propylene-based copolymer (B) contains 45 to 89% by mol of constituent units derived from propylene and 11 to 55% by mol of constituent units derived from at least one α-olefin selected from ethylene and α-olefins of 4 to 20 carbon atoms.

11 Claims, No Drawings

(56) References Cited

U.S. PATENT DOCUMENTS

2012/0263960 A1    10/2012   Song et al.
2013/0273386 A1    10/2013   Matsumoto et al.

FOREIGN PATENT DOCUMENTS

| | | |
|---|---|---|
| CN | 103210034 A | 7/2013 |
| JP | S63-267543 A | 11/1988 |
| JP | 2000-001769 A | 1/2000 |
| JP | 2005-059464 A | 3/2005 |
| JP | 2009-149063 A | 7/2009 |
| WO | WO-2007/086425 A1 | 8/2007 |
| WO | WO-2010/120295 A1 | 10/2010 |
| WO | WO-2012/077706 A1 | 6/2012 |
| WO | WO-2013/119316 A | 8/2013 |

* cited by examiner

LAMINATE, PACKAGING MATERIAL USING THE SAME AND PRODUCTION PROCESS FOR THE SAME

This application is a national stage of PCT International Application No. PCT/JP2014/081875, filed on Dec. 2, 2014, which claims priority to and incorporates by reference the entire contents of Japanese Patent Application No. 2013-253235 filed in Japan on Dec. 6, 2013.

TECHNICAL FIELD

The present invention relates to a laminate having at least a layer for deposition and a packaging material using the laminate. More particularly, the present invention relates to a laminate having at least a polyolefin resin layer, a layer for deposition and an inorganic layer laminated in this order, a packaging material using the laminate, and a production process for the laminate.

BACKGROUND ART

In order to fill-package a variety of foods and beverages, cosmetics, pharmaceutical products, miscellaneous goods and other articles, plastic flexible packaging bags of various shapes have been developed and put into practical use in the past. As laminated materials (laminates) that are packaging materials for forming the packaging bags, a variety of gas barrier materials having properties to prevent permeation of oxygen gas, water vapor and the like have been used from the viewpoints of protection of qualities of the contents, demand for extension of storage time, etc. However, there is a problem that sunlight from the sun, fluorescent light from a fluorescent lamp, or the like is transmitted, and this transmitted light exerts influence on the contents to cause decomposition of the contents, change of properties thereof or photo deterioration such as discoloration and others. On this account, a variety of light-shielding materials have been also studied and proposed. As the most popular material to impart a gas barrier function or a light-shielding function, a laminated film of an aluminum foil and a resin, an aluminum-deposited film or the like has been used.

Polyolefin-based resins including polypropylene are inexpensive, are excellent in moldability and are excellent also in oil resistance, sealing properties, etc., and therefore, they can exhibit excellent performance also in the case where they are used as such packaging materials as above (e.g., patent literatures 1 and 2). However, the polyolefin-based resins generally have poor adhesion to different materials, and hence, when a laminate of, for example, an inorganic layer of deposited aluminum or the like and such a resin is formed, deposition strength (bond strength) between the polyolefin-based resin layer and the inorganic layer is poor, and depending upon the use environment or the use purpose, an interlaminar peel (delamination) phenomenon sometimes takes place. In order to prevent such delamination, various methods have been proposed, and a part of them have been put into practical use. For example, for the purpose of enhancing adhesion to metals, etc., a method of grafting maleic anhydride or the like on polypropylene through a specific technique has been proposed, or for the purpose of imparting flexibility to polypropylene inherently having a property of rigidity, a method of compounding a soft rubber has been proposed (patent literatures 3 and 4).

On the other hand, in order to allow resin packaging bags for various foods including snacks, particularly inside parts of the bags, to have brightness and gloss, the bags are sometimes required to have metallic appearance (glitter feeling) or pearl-like appearance. Also the aforesaid packaging bags formed of aluminum foils or aluminum-deposited films are no exception, and for example, strong packaging bags hardly suffering delamination and having sufficient glitter feeling on the interior parts have been desired by customers in a specific region or food makers.

Enhancement of delamination prevention performance has become feasible by the aforesaid various proposals including a grafting method and a rubber compounding method, but it is still difficult to allow the packaging bags to simultaneously exhibit glitter feeling, and the need for it by the customers has increased.

CITATION LIST

Patent Literature

Patent literature 1: WO 2007/086425 A1
Patent literature 2: WO 2012/077706 A1
Patent literature 3: WO 2010/120295 A1
Patent literature 4: WO 2013/119316 A1

SUMMARY OF INVENTION

Technical Problem

The present invention has been made to solve the above problem, and addresses the problem of providing a laminate having a layer for deposition and a laminated film, each of which has sufficient delamination prevention performance, simultaneously has good appearance and an inorganic layer surface imparted with brightness and is excellent also in gas barrier properties, preferably a laminate and a laminated film mainly for packaging foods, each of which has at least a polyolefin resin layer, a layer for deposition and an inorganic layer laminated in this order.

Solution to Problem

In order to solve the above problem, the present inventors have earnestly studied, and as a result, they have found that the above problem can be solved by contriving composition of the layer for deposition, and have completed the present invention.

That is to say, according to the present invention, a laminate, a packaging material and a production process for them, which are described below, are provided.

The laminate of the present invention is characterized in that the laminate has at least a layer (II) for deposition and preferably has at least a polyolefin-based resin layer (I), a layer (II) for deposition and an inorganic layer (III) in this order, the layer (II) for deposition comprises a composition (P) for a layer for deposition and polypropylene (D) and is different from the polyolefin-based resin layer (I), the composition (P) for a layer for deposition is obtained by melt-kneading 30 to 85% by weight of isotactic polypropylene (A), 70 to 15% by weight of a propylene-based copolymer (B) (with the proviso that the total of (A) and (B) is 100% by weight), and if necessary, an additive, a part or all of the isotactic polypropylene (A) and/or the propylene-based copolymer (B) has been graft-modified with a graft monomer (C), and the propylene-based copolymer (B) is different from the isotactic polypropylene (A) and (i) contains 45 to 89% by mol of constituent units ($U_3$) derived from propylene and 11 to 55% by mol of constituent units ($U_0$) derived from at least one α-olefin selected from ethylene and α-olefins of 4 to 20 carbon atoms (with the proviso that the total of the constituent units ($U_3$) derived from propylene and the constituent units ($U_O$) derived from the α-olefin is 100% by mol).

The laminate of the present invention has at least a polyolefin-based resin layer (I), a layer (II) for deposition which comprises a composition (P) for a layer for deposition, and an inorganic layer (III) in this order, and in the composition (P) for a layer for deposition, a graft monomer (C), preferably an unsaturated carboxylic acid and/or its derivative (C), has been subjected to graft addition in an amount of 0.001 to 5 parts by weight based on 100 parts of weight of a composition comprising 30 to 85% by weight of isotactic polypropylene (A) and 70 to 15% by weight of a propylene-based copolymer (B) which is defined by the later-described requirement (i), preferably defined by the requirement (i) and the requirement (ii) or (iii), more preferably defined by the requirements (i) to (iii) (with the proviso that the total of the component (A) and the component (B) is 100% by weight).

The inorganic layer (III) is preferably a layer containing aluminum.

The packaging material of the present invention uses the laminate of the present invention.

The production process for a laminate having at least a layer for deposition according to the present invention is characterized by comprising a step (1) of melt-kneading 30 to 85% by weight of (graft-modified) isotactic polypropylene (A), 70 to 15% by weight of a (graft-modified) propylene-based copolymer (B) (with the proviso that the total of (A) and (B) is 100% by weight), and if necessary, an additive to produce a composition (P) for a layer for deposition, and a step (2) of producing a layer for deposition comprising the composition (P) for a layer for deposition and polypropylene (D).

Advantageous Effects of Invention

There are provided a laminate in which a polyolefin resin layer, a layer for deposition and an inorganic layer are laminated in this order and which has sufficient delamination prevention performance, has good appearance, has an inorganic layer surface imparted with glitter feeling and is excellent also in gas barrier properties, a packaging material using the laminate, and a production process for the laminate.

The packaging material of the present invention has the above-mentioned performance, is excellent in flexibility and is extremely strong.

DESCRIPTION OF EMBODIMENTS

Embodiments for carrying out the present invention will be hereinafter described in detail for each constituent feature, but they are exemplary embodiments of the present invention, and the present invention is not limited to the contents of them at all.

<Polyolefin-Based Resin Layer (I)>

The polyolefin-based resin layer (I) in the present invention is not specifically restricted provided that it is a layer formed of polyolefin. For example, polyolefin-based resins such as polyethylene, specifically low-density polyethylene (LDPE), high-density polyethylene (HDPE) or the like, acid-modified polyethylene, polypropylene, acid-modified polypropylene, a propylene/α-olefin copolymer, an ethylene/vinyl acetate copolymer, an ethylene/(meth)acrylic ester copolymer, an ethylene/(meth)acrylic acid copolymer and an ionomer, are used. Of these, polyethylene, polypropylene and a propylene/α-olefin copolymer are preferably used from the viewpoints of protection of the contents of packaging materials, low-temperature sealing properties, etc. Further, since good moldability can be obtained, homopolypropylene, a propylene/ethylene random copolymer and a propylene/butene random copolymer are particularly preferably used. As the polypropylene or the propylene/α-olefin copolymer, the later-described isotactic polypropylene (A), propylene-based copolymer (B) or polypropylene (D) may be used. These polyolefins may be used singly or as a mixture of two or more kinds. From the viewpoint that a laminate having good appearance is obtained, it is preferable to use the same polypropylene as the polypropylene (D).

The resin layer (I) is not specifically restricted, but it is preferably a film usually having a thickness of 1 μm to 1000 μm, preferably 1 to 200 μm.

In the resin layer (I), additives, such as ultraviolet absorbing agent, antioxidant, antistatic agent, surface active agent, pigment, fluorescent brightener, inorganic particles, specifically silica, calcium carbonate, titanium oxide and the like, and organic particles containing acrylic resin, styrene resin or the like as a constituent, may be contained when needed, within limits not detrimental to the effects of the present invention.

As the resin layer (I), a layer formed of one or more resins selected from polyolefins, such as polyethylene, poly-4-methyl-1-pentene and polybutene; cyclic olefin polymers; polyvinyl alcohol; an ethylene/vinyl alcohol copolymer; polystyrene; polyesters, such as polyethylene terephthalate, polybutylene terephthalate and polyethylene naphthalate; polyamides, such as nylon-6, nylon-11 and polymetaxylene adipamide; polycarbonate; polyvinyl chloride; polyvinylidene chloride; polyimide; polyethersulfone; polyacrylics; polyallylate; triacetyl cellulose; polyphenylene sulfide; and the like, may be used instead of the polyolefin-based resin layer (I) or together with the resin layer (I), within limits not detrimental to the effects of the present invention.

From the viewpoints of good extensibility, transparency and rigidity, preferable is a resin layer made of a film formed of polyolefin, such as polyethylene, poly-4-methyl-1-pentene or polybutene, acyclic olefin polymer, polyimide, polyethylene terephthalate, polyamide or the like among the above resins. The thickness of the film is the same as that previously described.

<Layer (II) for Deposition>

The layer (II) for deposition according to the present invention comprises a composition (P) for a layer for deposition and polypropylene (D) that are described later. The layer (II) for deposition is different from the polyolefin-based resin layer (I).

It is presumed that excellent adhesion of the layer (II) for deposition to the inorganic layer (III) is attributable to a reaction of a functional group of graft-modified isotactic polypropylene (A) or graft-modified propylene-based copolymer (B), or graft-modified isotactic polypropylene (A) and graft-modified propylene-based copolymer (B), with a hydrogen group or a hydroxyl group on the inorganic layer surface, such as a hydrogen group derived from water or a hydroxyl group derived from an oxide film, and attributable to a physical effect due to flexibility of a propylene-based copolymer (B). It is presumed that the propylene-based copolymer (B) is completely compatibilized in the layer (II) for deposition or extremely finely dispersed therein to thereby impart brightness or gloss and transparency to the laminate. The layer for deposition comprises polypropylene (D), preferably the same polypropylene as the polypropylene for forming the polyolefin-based resin layer (I), together with the composition (P), and therefore, good moldability can be obtained while excellent adhesion between layers is maintained. On that account, a laminate having high interlaminar peel strength and having good appearance (brightness, gloss, transparency) can be obtained economically.

The composition (P) for a layer for deposition is obtained by melt-kneading 30 to 85% by weight of isotactic polypropylene (A), 70 to 15% by weight of a propylene-based copolymer (B) (with the proviso that the total of (A) and (B) is 100% by weight), and if necessary, an additive, and a part or all of the isotactic polypropylene (A) and/or the propylene-based copolymer (B) has been graft-modified with a graft monomer (C)

It is also preferable that the layer for deposition (II) comprises a melt kneadate and the polypropylene (D), in said melt kneadate, a graft monomer (C), preferably an unsaturated carboxylic acid and/or its derivative (C), having been subjected to graft addition in an amount of 0.001 to 5 parts by weight based on 100 parts of weight of a composition comprising 30 to 85% by weight of the isotactic polypropylene (A), 70 to 15% by weight of the propylene-based copolymer (B), and if necessary, an additive (with the proviso that the total of the component (A) and the component (B) is 100% by weight).

The layer (II) for deposition is not specifically restricted, but it usually has a thickness of 1 μm to 1000 μm, preferably 1 to 100 μm.

In the layer (II) for deposition, additives described for the aforesaid resin layer (I) may be contained when needed, within limits not detrimental to the effects of the present invention.

The components are described in detail hereinafter.

((A) Isotactic Polypropylene)

As the isotactic polypropylene (A) (also referred to as a "component (A)") for use in the present invention, a homopolymer of propylene or a propylene/α-olefin copolymer can be mentioned. The propylene/α-olefin copolymer is different from the later-described propylene-based copolymer (B).

The α-olefin species is not specifically restricted, but ethylene and/or an α-olefin of 4 to 20 carbon atoms can be preferably mentioned. These α-olefins may be used singly or in combination of two or more kinds. Examples of α-olefins of 2 to 20 carbon atoms other than propylene include ethylene, 1-butene, 1-pentene, 3-methyl-1-butene, 1-hexene, 4-methyl-1-pentene, 1-octene and 1-decene. In the present invention, a more preferred α-olefin is ethylene or an α-olefin of 4 to 10 carbon atoms, and above all, ethylene or an α-olefin of 4 to 8 carbon atoms is particularly preferable.

Here, the content of constituent units derived from propylene in the propylene/α-olefin copolymer is preferably not less than 90% by mol based on 100% by mol of the total of the constituent units derived from propylene and constituent units derived from an α-olefin of 2 to 20 carbon atoms other than propylene.

The melt flow rate (MFR) of the polypropylene (A) is not specifically restricted, but it is preferably 0.1 to 100 g/10 min, more preferably 0.5 to 50 g/10 min. In the present specification, not only for the isotactic polypropylene (A) but also for the propylene-based copolymer (B) and the polypropylene (D), MFR is a value measured at 230° C. under a load of 2.16 kg in accordance with ASTM D 1238.

The melting point (Tm) of the polypropylene (A), which is observed in DSC measurement in which the polypropylene is maintained at 200° C. for 10 minutes in a DSC measurement apparatus, then cooled down to −20° C. at a cooling rate of 10° C./min, maintained at −20° C. for 1 minute and then heated again at a heating rate of 10° C./min, is usually higher than 120° C. but not higher than 170° C., preferably 130 to 160° C.

The density of the polypropylene (A), as measured by a density gradient tube method in accordance with JIS K 7112, is not specifically restricted, but it is usually 0.900 to 0.920 g/cm$^3$, preferably 0.900 to 0.915 g/cm$^3$. If the density is less than 0.900 g/cm$^3$, transparency or blocking resistance of the layer (II) for deposition is sometimes deteriorated. On the other hand, if the density is higher than 0.920 g/cm$^3$, transparency and impact resistance of the layer (II) for deposition are liable to be lowered.

The molecular weight distribution (Mw/Mn, Mw: weight-average molecular weight, Mn: number-average molecular weight, both being in terms of polystyrene) of the polypropylene (A), as measured by gel permeation chromatography (GPC), is not specifically restricted, but it is preferably not more than 10.0, more preferably not more than 8.5. Although the lower limit is not specifically restricted, it is 1.8.

The production process for the polypropylene (A) is not specifically restricted, and the polypropylene can be produced by a well-known process using a well-known catalyst such as a Ziegler-Natta catalyst or a metallocene catalyst. Further, a crystalline polymer can be preferably used, and in the case of a copolymer, the copolymer may be a random copolymer or may be a block copolymer. Moreover, there is no specific limitation also on the stereoregularity and the molecular weight provided that satisfactory moldability is obtained and the resulting molded product has strength to withstand use. It is also possible to use a commercially available resin as it is.

The isotactic polypropylene (A) preferably used in the present invention is homopolypropylene, a propylene/ethylene random copolymer, a propylene/1-butene random copolymer or a propylene/ethylene/1-butene random copolymer.

To the polypropylene (A), additives, such as antioxidant, light stabilizer, ultraviolet absorbing agent, metallic soap, hydrochloric acid absorbent, lubricant, antistatic agent, antifogging agent and anti-blocking agent, may be added without deviating from the object of the present invention. The amount of such an additive added has only to be within limits not detrimental to the object of the present invention though it varies depending upon the type of the additive. The amount thereof is usually not more than 3 parts by weight based on 100 parts by weight of the polypropylene.

((B) Propylene-Based Copolymer)

The propylene-based copolymer (B) (also referred to as a "component (B)") in the present invention satisfies the following requirement (i), preferably satisfies the requirement (i) and the requirement (ii) or (iii), and more preferably satisfies all of the requirements (i) to (iii). The propylene-based copolymer (B) is different from the isotactic polypropylene (A).

(i) The propylene-based copolymer contains constituent units ($U_3$) derived from propylene in amounts of 45 to 89% by mol and constituent units ($U_O$) derived from at least one α-olefin selected from ethylene and α-olefins of 4 to 20 carbon atoms in the total amount of 11 to 55% by mol (with the proviso that the total of the constituent units ($U_3$) derived from propylene and the constituent units ($U_O$) derived from the α-olefin is 100% by mol).

(ii) The melting point (Tm) as measured by a differential scanning calorimeter is not higher than 120° C., or the melting point is not observed. As for the method for measuring the melting point, the working examples can be referred to.

(iii) The molecular weight distribution (Mw/Mn) as determined by gel permeation chromatography (GPC) is in the range of 1.0 to 3.0.

As ethylene and the α-olefin of 4 to 20 carbon atoms in the requirement (i), straight-chain or branched α-olefins can be mentioned.

Examples of the straight-chain α-olefins include straight-chain α-olefins of 2 to 20 carbon atoms except propylene, such as ethylene, 1-butene, 1-pentene, 1-hexene, 1-octene, 1-decene, 1-dodecene, 1-tetradecene, 1-hexadecne, 1-octadecene and 1-eicosene. Of these, straight-chain α-olefins of 2 to 10 carbon atoms, such as ethylene, 1-butene, 1-pentene, 1-hexene, 1-octene and 1-decene, are preferable.

Examples of the branched α-olefins include branched α-olefins of 4 to 20 carbon atoms, such as 3-methyl-1-butene, 4-methyl-1-pentene, 3-methyl-1-pentene, 3-ethyl-1-pentene, 4,4-dimethyl-1-pentene, 4-methyl-1-hexene, 4,4,-dimethyl-1-hexene, 4-ethyl-1-hexne and 3-ethyl-1-hexene. Preferable are branched α-olefins of 5 to 10 carbon atoms.

The above α-olefins may be uses singly or in combination of two or more kinds.

With regard to the amount of constituent skeleton attributable to each olefin in the requirement (i), the amount of the constituent units ($U_3$) derived from propylene is 45 to 89% by mol, preferably 52 to 85% by mol, more preferably 60 to 82% by mol. The total amount of the constituent units ($U_0$) derived from at least one α-olefin selected from ethylene and α-olefins of 4 to 20 carbon atoms is usually 11 to 55% by mol, preferably 15 to 48% by mol, more preferably 18 to 40% by mol. Here, the total of the constituent units ($U_3$) derived from propylene and the constituent units ($U_0$) derived from the α-olefin is 100% by mol. From the viewpoint of ease of obtaining, the propylene-based copolymer is preferably a propylene-based copolymer containing only the constituent units ($U_2$) derived from ethylene or containing only the constituent units ($U_4$) derived from 1-butene or containing both of the constituent units ($U_2$) and ($U_4$) derived from ethylene and 1-butene, as the constituent units ($U_0$) derived from the α-olefin.

In the case where the constituent units ($U_2$) derived from ethylene and the constituent units ($U_{4-20}$) derived from an α-olefin of 4 to 20 carbon atoms are both contained as the constituent units ($U_0$) derived from the α-olefin, the amount of the constituent units ($U_2$) derived from ethylene is usually 10 to 25% by mol, preferably 10 to 23% by mol, more preferably 12 to 17% by mol, with the proviso that the total of the constituent units ($U_3$) derived from propylene, the constituent units ($U_2$) derived from ethylene and the constituent units ($U_{4-20}$) derived from an α-olefin of 4 to 20 carbon atoms is 100% by mol. The amount of the constituent units ($U_{4-20}$) derived from an α-olefin is usually 1 to 30% by mol, preferably 5 to 25% by mol, more preferably 6 to 23% by mol, with the proviso that the total of $U_3$, $U_2$ and $U_{4-20}$ is 100% by mol. As the copolymer, a propylene/ethylene/1-butene terpolymer is preferable.

In the case where only the constituent units ($U_2$) derived from ethylene are contained as the constituent units ($U_0$) derived from the α-olefin, the amount of the constituent units ($U_2$) derived from ethylene is usually 11 to 55% by mol, preferably 15 to 48% by mol, more preferably 18 to 40% by mol, based on 100% by mol of the total of the constituent units ($U_3$) derived from propylene and the constituent units ($U_2$) derived from ethylene. When the propylene-based copolymer (B) is a propylene/ethylene bipolymer, this bipolymer is preferable because of excellent balance between rigidity and ease of handling during molding.

In the case where the propylene-based copolymer (B) contains the constituent units ($U_{4-20}$) derived from an α-olefin of 4 to 20 carbon atoms in the present invention, the constituent units ($U_4$) derived from 1-butene are preferably used as the constituent units ($U_{4-20}$). The amount of the constituent units ($U_4$) derived from 1-butene is usually 11 to 55% by mol, preferably 15 to 48% by mol, more preferably 18 to 40% by mol, based on 100% by mol of the total of the constituent units ($U_3$) derived from propylene and the constituent units ($U_4$) derived from 1-butene. The reason is that 1-butene is one of stably obtainable olefins among the α-olefins of 4 to 20 carbon atoms and that when the layer (II) for deposition is formed from a composition composed of a melt kneadate of the isotactic polypropylene (A) and the propylene-based copolymer (B) and publicly known polypropylene, selection of 1-butene enhances compatibility of both resins of the propylene-based copolymer (B) and the polypropylene with each other to thereby improve properties of the layer (II) for deposition. From such viewpoints, the propylene-based copolymer (B) is also preferably a propylene/1-butene bipolymer or a propylene/ethylene/1-butene terpolymer.

The amount (% by mol) of the constituent units derived from each comonomer in the propylene-based copolymer (B) can be determined by a publicly known technique for analyzing $^{13}$C-NMR spectrum.

As long as the effects of the present invention are exerted, the propylene-based copolymer (B) may contain, for example, cyclic olefins, conjugated dienes, non-conjugated polyenes, aromatic vinyl compounds, functional group-containing vinyl compounds, etc. in small amounts as the monomers to constitute an olefin-based polymer, when needed. The amount of constituent units of these monomers is usually not more than 10% by weight, preferably not more than 5% by weight, based on 100% by weight of all of the constituent units.

In the case where a melting point (Tm) exists with regard to the requirement (ii), the melting point is preferably in the range of 40 to 120° C. When the melting point is in the range of 45 to 115° C., flexibility is increased during deposition, and therefore, the deposition strength is enhanced, so that such a range is more preferable. The expression "melting point is not observed" means that a crystal melting peak having a crystal melting heat of not less than 1 J/g is not observed in the range of −150 to 200° C. The melting point (Tm) is a melting point detected on a DSC curve obtained by subjecting a specimen to conditioning at 23° C.±2° C. for not shorter than 72 hours, thereafter cooling the specimen down to −40° C. and heating it at a heating rate of 10° C./min.

With regard to the requirement (iii), Mw/Mn is preferably in the range of 1.0 to 2.8. When Mw/Mn is in the range of 1.0 to 2.5, molding appearance becomes better, so that such a range is more preferable.

MFR of the propylene-based copolymer (B) is not specifically restricted, but it is preferably 0.1 to 100 g/10 min, more preferably 0.5 to 50 g/10 min.

The density of the copolymer (B), as measured by a density gradient tube method in accordance with JIS K 7112, is not specifically restricted, but it is preferably 0.800 to 0.900 g/cm$^3$, more preferably 0.820 to 0.890 g/cm$^3$.

The production process for the propylene-based copolymer (B) is not specifically restricted, and the copolymer can be produced by a well-known process using a well-known catalyst such as a Ziegler-Matta catalyst or a metallocene catalyst. As publicly known literatures in which a production process using a metallocene catalyst is disclosed, Japanese Patent Publication No. 1994-820 and Japanese Patent No. 3580428 having been applied by the present applicant and already laid open, etc. can be mentioned. Further, there is no specific limitation also on the stereoregularity and the molecular weight provided that satisfactory moldability is obtained and the resulting molded product has strength to withstand use. It is also possible to use a commercially available resin as it is.

Composition (P) for Layer for Deposition

The composition (P) for a layer for deposition according to the present invention is obtained by melt-kneading 30 to 85% by weight, preferably 40 to 80% by weight, more preferably 45 to 75% by weight, of the isotactic polypropylene (A), 70 to 15% by weight, preferably 60 to 20% by weight, more preferably 55 to 25% by weight, of the propylene-based copolymer (B), and if necessary, the later-described additive (with the proviso that the total of the component (A) and the component (B) is 100% by weight). Prior to the melt kneading, a part or all of the isotactic polypropylene (A) and/or the propylene-based copolymer (B) has been graft-modified with a graft monomer (C). That is to say, in the raw materials of the composition (P), a graft-modified product is included.

In the composition (P) for a layer for deposition according to the present invention, a graft monomer (C), preferably an unsaturated carboxylic acid and/or its derivative (C), has been subjected to graft addition in an amount of 0.001 to 5 parts by weight based on 100 parts by weight of a composition composed of 30 to 85% by weight, preferably 40 to 80% by weight, more preferably 45 to 75% by weight, of the isotactic polypropylene (A) and 70 to 15% by weight, preferably 60 to 20% by weight, more preferably 55 to 25% by weight, of the propylene-based copolymer (B) (with the proviso that the total of the component (A) and the component (B) is 100% by weight).

In the present invention, by adjusting the component ratios of the component (A) and the component (B) to the above ranges, it becomes possible to obtain an adhesive excellent not only in initial adhesion but also in adhesion after heat history.

In the composition (P) for a layer for deposition according to the present invention, both of the component (A) and the component (B) to constitute the composition (P) may have been partially graft-modified, or any one of the component (A) and the component (B) may have been partially graft-modified. Examples of the graft monomers (C) include unsaturated carboxylic acids, such as acrylic acid, methacrylic acid, α-ethylacrylic acid, maleic acid, fumaric acid, itaconic acid, citraconic acid, tetrahydrophthalic acid, methyltetrahydrophthalic acid, crotonic acid, endocis-bicyclo[2,2,1]hept-5-ene-2,3-dicarboxylic acid (Nadic Acid™) and methyl-endocis-bicyclo[2,2,1]hept-5-endo-2,3-dicarboxylic acid (Methylnadic Acid™), and derivatives, such as acid halides, nitriles, amides, imides, acid anhydrides and esters of unsaturated dicarboxylic acids. Specific examples of such derivatives include malenyl chloride, maleimide, maleic anhydride, citraconic anhydride, monomethyl maleate, dimethyl maleate, (meth)acrylonitrile, acrylamide, malenylimide, N-alkyl-substituted (meth)acrylamides, carboxylic acid vinyl esters, glycidyl methacrylate, 2-hydroxyethyl methacrylate, and 2-(N,N-dimethylamino)ethyl methacrylate. These compounds (graft monomers) can be used singly or in combination. Of these, unsaturated carboxylic acids and/or their derivatives can be preferably used. Examples of the unsaturated carboxylic acids and/or their derivatives include unsaturated compounds having one or more carboxylic acid groups and salts thereof, esters of unsaturated carboxylic acid compounds having a carboxylic acid group and alkyl alcohols, and unsaturated compounds having one or more carboxylic anhydride groups (e.g., anhydrides of unsaturated dicarboxylic acids). Examples of unsaturated groups include a vinyl group, a vinylene group and an unsaturated cyclic hydrocarbon group. When the unsaturated carboxylic acids and/or their derivatives are used in the present invention, they can be used singly or can be used in combination of two or more kinds. Of these, more preferably used are unsaturated dicarboxylic acids, such as maleic acid, Nadic Acid™ and itaconic acid, or acid anhydrides thereof, and acrylic acid and methacrylic acid, or derivatives thereof; particularly preferably used are maleic acid and Nadic Acid™, or acid anhydrides thereof; and most preferably used is maleic anhydride.

The content of the graft monomer (C) is usually 0.001 to 5 parts by weight, preferably 0.01 to 3 parts by weight, based on 100 parts by weight of the composition (P). The graft quantity of the graft monomer (C) is usually 0.001 to 5 parts by weight, preferably 0.01 to 3 parts by weight, based on 100 parts of weight of the total of the isotactic polypropylene (A) and the propylene-based polymer (B). Since the content and the graft quantity of the graft monomer (C) are in the above ranges, the layer (II) for deposition comprising the composition (P) for a layer for deposition according to the present invention exhibits high bond strength to the inorganic layer (III). Control of the content and the graft quantity of the graft monomer can be easily carried out by, for example, properly selecting the grafting conditions.

(Grafting Method)

When the graft monomer is grafted in the present invention, the grafting method is not specifically restricted, and hitherto publicly known graft polymerization such as solution method or melt kneading method can be adopted. Examples of such methods include a method comprising melting a polymer and adding a graft monomer to the melt to perform graft reaction and a method comprising dissolving a polymer in a solvent to give a solution and adding a graft monomer to the solution to perform graft reaction.

In the graft modification, it is preferable to graft-modify the component (A) and/or the component (B) with the graft monomer in the presence of a radical initiator such as an organic peroxide or an azo compound. The radical initiator can be used by mixing it as it is with the component (A), the component (B) and the graft monomer, but it can be also used after it is dissolved in a small amount of an organic solvent. The organic solvent can be used without any restriction provided that it is an organic solvent capable of dissolving the radical initiator. In the graft modification, a reducing substance may be used. By the use of the reducing substance, the graft quantity of the graft monomer can be increased.

The graft modification can be carried out by a hitherto publicly known method, and for example, the graft modification can be carried out by dissolving the component (A) and/or the component (B) in an organic solvent, then adding a graft monomer, a radical initiator, etc. to the solution and allowing them to react with each other usually at a temperature of 70 to 200° C. usually for 0.5 to 15 hours. Further, by allowing the component (A) and/or the component (B) to react with a graft monomer in the absence of a solvent using an extruder or the like, a modified product can be also produced.

Examples of the organic peroxides include dicumyl peroxide, di-t-butyl peroxide, 2,5-dimethyl-2,5-di(t-butylperoxy)hexane, 2,5-dimethyl-2,5-di(t-butylperoxy)hexyne-3, 1,3-bis(t-butylperoxyisopropyl)benzene, 1,1-bis(t-butylperoxy)-3,3,5-trimethylcyclohexane, n-butyl-4,4-bis(t-butylperoxy)valerate, benzoyl peroxide, p-chlorobenzoyl peroxide, 2,4-dichlorobenzoyl peroxide, t-butyl peroxybenzoate, t-butyl perbenzoate, t-butylperoxy isopropyl carbonate, diacetyl peroxide, lauroyl peroxide and t-butylcumyl peroxide.

Examples of the azo compounds include 2,2'-azobis(4-methoxy-2,4-dimethylvaleronitrile), 2,2'-azobis(2-methylbutylnitrile), 2,2'-azobis(isobutyronitrile) and dimethyl-2,2'-azobis(2-methylpropionate).

These organic peroxides or azo compounds may be used singly, or may be used in combination of two or more kinds.

The amount of the organic peroxide or the azo compound used is usually 0.01 to 30 parts by weight based on 100 parts by weight of the (co)polymer used for the graft reaction.

(Production Process for Composition (P) for Layer for Deposition)

The production process for the composition (P) for a layer for deposition according to the present invention is not specifically restricted, and publicly known processes can be adopted without any restriction. For example, graft modification is carried out in the simultaneous presence of the isotactic polypropylene (A) and the propylene-based copolymer (B) or carried out by graft-modifying a part or all of the component (A) and the component (B) and then mixing unmodified residues of the components. Thereafter, the later-described arbitrary components (additives) are added, and then the mixture is melt-kneaded, whereby a composition for a layer for deposition that is a modified polyolefin composition can be obtained.

It is also preferable to obtain the composition (P) by graft-modifying a part of the isotactic polypropylene (A) with an unsaturated carboxylic acid and/or its derivative (C) and then melt-mixing an unmodified component (A) and the propylene-based copolymer (B).

In the present invention, a process comprising graft-modifying apart or all of the isotactic polypropylene (A) and then melt-mixing the graft-modified product, the propylene-based copolymer (B), and if necessary, additives is preferable. In the present invention, a process comprising graft-modifying a part of the isotactic polypropylene (A) and then melt-mixing an unmodified component (A) and the propylene-based copolymer (B) is preferable.

As the melt kneading method, for example, a method comprising dryblending the resin composition and then melt-kneading the dryblend by a single screw or twin-screw extruder, a Banbury mixer, a roll, any of various kneaders, or the like can be mentioned, and an extruder is preferably used industrially. The temperature in the melt kneading is not specifically restricted provided that the components (A) and (B) are melted, but in general, the melt kneading is carried out usually in the temperature range of 160 to 300° C., preferably 180 to 250° C.

With the composition (P) for a layer for deposition according to the present invention, other elastomers capable of being mixed can be blended within limits not detrimental to the object of the present invention. When other elastomers are blended, the amount thereof is usually less than 10 parts by weight based on 100 parts by weight of the composition (P) for a layer for deposition. The elastomers may be blended simultaneously with blending of the aforesaid components (A) and (B), or may be mixed with a composition containing the components (A) and (B) after the composition is obtained.

To the composition (P) for a layer for deposition according to the present invention, additives, such as publicly known processing stabilizer, heat stabilizer, heat aging resisting agent, filler, tackifier, processing aid, anti-aging agent, weathering stabilizer, antistatic agent, colorant, lubricant and thickening agent, can be also added within limits not detrimental to the object of the present invention. These additives are not specifically restricted as long as the effects of the present invention are exerted, and the amount thereof is usually not more than 5 parts by weight, preferably not more than 1 part by weight, based on 100 parts by weight of the composition (P), though it depends upon the intended use or the type. In the present invention, a so-called tackifier can be added for the purpose of imparting tack. Examples of substances to impart tack include rosin derivatives, terpene resin, petroleum resin, and hydrogenation products thereof. Of these, hydrogenated terpene resin and hydrogenated petroleum resin are preferable.

Even when only the composition (P) for a layer for deposition is used or even when a blend of the composition (P) for a layer for deposition, the elastomer and various additives is used, the layer (II) for deposition sufficiently exhibits the effects of the present invention. However, depending upon the intended use or the use environment in which a packaging material in final form is used, a layer (II) for) for deposition comprising a composition further containing publicly known polypropylene (D) in addition to the composition (P) for a layer for deposition is preferably used. If the layer (II) for deposition is obtained by a process including a step (1) of producing the composition (P) for a layer for deposition and a step (2) of producing a layer for deposition containing the composition (P) for a layer for deposition and the polypropylene (D), a laminate including the layer (II) for deposition has sufficient delamination prevention performance. Further, the layer (II) for deposition has good adhesion to the inorganic layer, and therefore, brightness of the inorganic layer is enhanced. For the reason that the layer (II) for deposition contains a graft-modified product and has flexibility, the inorganic layer is preferably an aluminum foil or an aluminum deposition film layer. Since the layer (II) for deposition is particularly excellent in adhesion to an aluminum foil or an aluminum deposition film layer, glitter feeling (gloss)) inherent in aluminum can be especially brought out.

The polypropylene (D) is, for example, a homopolymer of propylene, a propylene/$\alpha$-olefin copolymer or the aforesaid isotactic polypropylene (A), and from the viewpoints of economy, versatility, ease of obtaining, etc., a homopolymer of propylene or a propylene/$\alpha$-olefin copolymer is preferable. Although the $\alpha$-olefin species in the propylene/$\alpha$-olefin copolymer is not specifically restricted, it is preferably ethylene and/or an $\alpha$-olefin of 4 to 20 carbon atoms. These $\alpha$-olefins may be used singly or in combination of two or more kinds. The $\alpha$-olefins and the content of the constituent units are the same as those described in the section of the polypropylene (A).

The polypropylene (D) may be the same as or different from the polypropylene (A).

The polypropylene (D) may be the same as or different from the propylene-based copolymer (B), but from the viewpoint of moldability, they are preferably different from each other. As the polypropylene (D), a graft-modified product obtained from the component (A) may be used, but from the viewpoint of economy, an unmodified substance is preferable.

The melt flow rate (MFR) of the polypropylene (D) is not specifically restricted as long as the effects of the present invention are exerted, but it is preferably 0.1 to 100 g/10 min, more preferably 0.5 to 50 g/10 min.

The melting point (Tm) of the polypropylene (D), as observed by DSC measurement, is not specifically restricted as long as the effects of the present invention are exerted, but it is usually 130 to 165° C., preferably 132 to 162° C. The method for measuring the melting point is identical with that for the polypropylene (A).

The density of the polypropylene (D), as measured by a density gradient tube method in accordance with JIS K 7112, is not specifically restricted as long as the effects of the present invention are exerted, but it is usually 0.900 to 0.920 g/cm$^3$, preferably 0.905 to 0.915 g/cm$^3$. If the density is less than 0.900 g/cm$^3$, transparency or blocking resistance of the layer (II) for deposition is sometimes deteriorated. On the other hand, if the density is higher than 0.920 g/cm$^3$, transparency and impact resistance of the layer (II) for deposition are liable to be lowered.

The molecular weight distribution (Mw/Mn, Mw: weight-average molecular weight, Mn: number-average molecular weight, both being in terms of polystyrene) of the polypropylene (D), as measured by gel permeation chromatography (GPC), is not specifically restricted, but it is preferably not more than 3.5, more preferably not more than 3.0. Although the lower limit is not specifically restricted, it is 1.8.

To the polypropylene (D), such various additives as described for the polypropylene (A) may be added without deviating from the object of the present invention. The amount of such an additive added has only to be within limits not detrimental to the object of the present invention though it varies depending upon the type of the additive. The amount thereof is usually not more than 3 parts by weight based on 100 parts by weight of the polypropylene.

The production process for the polypropylene (D) is identical with that for the polypropylene (A).

When the polypropylene (D) is blended with the composition (P) for a layer for deposition and the blend is used for the layer (II) for deposition, the blending ratio (ratio by weight) between the composition (P) for a layer for deposition and the polypropylene (D) is not specifically restricted, but it is usually in the range of 95:5 to 5:95, preferably in the range of 80:20 to 20:80, more preferably in the range of 70:30 to 30:70. For preparing the layer (II) for deposition from the composition (P) for a layer for deposition and publicly known polypropylene that is used when needed, hitherto known processes can be used without any restriction.

<Inorganic Layer (III)>

The inorganic layer (III) is not specifically restricted as long as the effects of the present invention are exerted, and for example, metals containing elements, such as gold (Au), copper (Cu), iron (F), chromium (Cr), zinc (Zn), cobalt (Co), aluminum (Al), titanium (Ti), tin (Sn), indium (In) and silicon (Si), and inorganic compounds, such as oxides, nitrides, nitroxides, sulfides, phosphides, phosphorus oxides, phosphorus nitrides and phosphorus nitroxides of the above elements can be mentioned.

As preferred inorganic matters used for the inorganic layer (III) in the present invention, metals, metal oxides, etc. can be mentioned. The metal used for the inorganic layer (II) is not specifically restricted as long as the effects of the present invention are exerted, but aluminum, gold, copper, iron, etc. can be mentioned, and as the metal oxides, oxides of these metals can be mentioned.

As the inorganic layer (III) of the present invention, a metal foil can be used as it is, or a layer of a deposition film can be formed. In the case of a metal foil, one of the above metals or an alloy of two or more of them may be used. In the case of a deposition film, one or more metals may be used. Specific examples of preferred layers among such layers include an aluminum foil, a gold foil, an aluminum deposition layer, a silica deposition layer, an alumina deposition layer and a silica-alumina binary deposition layer. Of these, an aluminum foil or an aluminum deposition film layer is particularly preferable because they are inexpensive, have high barrier properties and can impart light-shielding properties.

For forming the inorganic layer (III) on the layer (II) for deposition, a vapor phase process, a wet process or the like can be mentioned.

As methods for forming the layer by a vapor phase process, publicly known methods, e.g., chemical vapor deposition methods, such as chemical vapor deposition (CVD), catalyst CVD (CAT-CVD), low-pressure CVD and plasma CVD; and physical vapor deposition methods (PVD), such as vacuum deposition (reactive vacuum deposition), sputtering (reactive sputtering) and ion plating (reactive ion plating), can be mentioned.

In the case of a metal foil, the thickness of the inorganic layer (III) is usually 0.1 to 100 μm, preferably 1 to 50 μm, particularly preferably 3 to 30 μm. In the case of an inorganic deposition film, the thickness thereof is usually 10 to 5000 Å, preferably 50 to 1000 Å, more preferably 100 to 600 Å, particularly preferably 300 to 500 Å. If the thickness of the inorganic layer is too small, sufficient barrier properties are not obtained in some cases. If the thickness thereof is too large, the weight of a packaging material is increased to make handling inconvenient, and in the case of a deposition layer, cracks are liable to occur.

<Transparent Sealant Layer (IV)>

A transparent sealant layer (IV) can be also used by providing it adjacently to the inorganic layer (III) though the sealant layer is not essential in the laminate of the present invention. In this case, the laminate is a laminate having a polyolefin resin layer (I), a layer (II) for deposition formed of a composition (P) for a layer for deposition, preferably a layer (II) for deposition comprising the composition (P) and polypropylene (D), an inorganic layer (III) and a transparent sealant layer (IV) that are laminated in this order. By providing the transparent sealant layer (IV), this layer exerts a heat-sealing function and can simultaneously maintain brightness of the adjacent inorganic layer (III) because of transparency.

As resins employable for the transparent sealant layer (IV), publicly known polyethylene-based resins, polypropylene-based resins and cyclic polyolefin-based resins are used without any restriction. From the viewpoints of transparency, rigidity, low-temperature heat-sealing properties, heat-sealing strength, low-temperature impact strength, etc., it is preferable to use, for example, a composition composed of a polypropylene resin, an ethylene/α-olefin copolymer and a propylene/α-olefin copolymer or a composition composed of a polypropylene resin, an ethylene/α-olefin copolymer and a 1-butene/α-olefin copolymer.

For forming the transparent sealant layer (IV), a method of directly extrusion-coating the inorganic layer (III) with the above resin or composition or a method of dry-laminating a laminate including the polyolefin resin layer (I), the layer (II) for deposition and the inorganic layer (III) with a sealant film or coextruding the laminate and a sealant film can be adopted.

The sealant film can be produced by molding the above resin or resin composition into a film. For molding it into a film, publicly known methods by which polyolefin films can be obtained, such as casting, inflation method and extrusion coating, can be adopted, but from the viewpoint that the laminate of the present invention can be efficiently obtained, extrusion coating is preferable. In the case of the casting and the inflation method, a good film having a uniform thickness can be produced usually under the conditions of a resin temperature of 160 to 240° C. In the case of the extrusion coating, conditions of a resin temperature of 200 to 320° C. can be usually adopted.

The thickness of the transparent sealant layer (sealant film) is not specifically restricted as long as the effects of the present invention are exerted, but it is usually 1 to 100 μm, preferably 3 to 80 μm.

<Other Layers>

In the laminate of the present invention, to the surfaces of the inorganic layer (III) and the transparent sealant layer (IV), publicly known various coating agents, e.g., various resins with which coating is possible, such as polyester-based, polyurethane-based, acrylic, polyvinyl acetate-based and ionomer-based resins, may be applied in order to enhance surface protection, printability, lamination suitability, etc.

The surface of each layer to constitute the laminate of the present invention may have been subjected to surface treatment or undercoating. Examples of the surface treatments include ozone treatment, corona discharge treatment, plasma treatment, glow discharge treatment, reverse sputtering treatment, flame treatment, chromic acid treatment, solvent treatment and surface-roughening treatment. Anchor coating agents can be composed of various resins, such as thermoplastic resins, thermosetting resins, light-curable resins and coupling agents. By particularly carrying out corona discharge treatment or plasma treatment, oxygen permeability and moisture permeability are lowered, whereby a laminate having more excellent gas barrier properties can be obtained. By particularly subjecting the surface of the layer (II) for deposition to the above surface treatment, particularly preferably corona discharge treatment, plasma treatment or ozone treatment, adhesion of the layer for deposition to the inorganic layer (III) becomes better.

<Production Process for Laminate>

The laminate of the present invention can be produced by a publicly known method. For example, the laminate can be produced by coextrusion methods, such as T-die method, inflation method, casting, tube extrusion and extrusion coating. Further, a method comprising producing a single layer or multilayer film and then subjecting the film to dry lamination by heating can be given as an example. In the present invention, a coextrusion method in which plural components are fed to a multilayer extrusion machine to produce a laminate is preferably used from the viewpoint of productivity.

<Uses>

The laminate of the present invention is excellent in brightness (glitter feeling) and transparency, has high interlaminar peel strength and is excellent also in gas barrier properties, and therefore, it is preferably used in various fields. For example, food field, such as field of food packaging films or food containers, e.g., cups, bottles, trays, tubes and BIB (bag-in-box), can be mentioned. However, also because of excellent gas barrier properties, the laminate can be preferably used also in non-food applications such as pipes.

(Packaging Material)

The packaging material of the present invention comprises the laminate of the present invention, and is preferably used as a material (packaging material) of packaging containers or packaging bags for foods and beverages, cosmetics or miscellaneous goods or for food packaging, filling packaging or fiber packaging.

The packaging container or the packaging bag may be obtained by forming a laminate in the form of a film or a sheet into a desired shape through vacuum forming or pressure forming, or may be obtained by producing a laminate so as to have a desired shape of a packaging container or a packaging bag. The packaging container and the packaging bag have their inner surfaces with excellent brightness (glitter feeling) and transparency, have high interlaminar peel strength and are excellent also in gas barrier properties.

The packaging container or the packaging bag containing the contents is obtained by filling a container or a bag with the contents, then covering it with a publicly known film as a cover material and heat-sealing the top and the sides of the container. The container and the bag are preferably utilized for packaging instant noodles, miso, jelly, pudding, snacks, etc.

EXAMPLES

The present invention is further described with reference to the following examples and comparative examples, but it should be construed that the present invention is in no way limited to those examples as long as they do not depart from the spirit of the present invention.

(Various Measuring Methods)

In the examples, etc., measurements were carried out in accordance with the following methods.

[Melt Flow Rate (MFR, g/10 Min)]

Unless otherwise noted, melt flow rate was measured at 230° C. under a load of 2.16 kg in accordance with ASTM D 1238.

[Density (g/cm$^3$)]

Density was measured in accordance with JIS K 7112.

[Melting Point (Tm, ° C.)]

Melting point was determined from an endothermic curve of DSC. In the DSC measurement of the melting points of the component (A), a graft-modified product of the component (A) and the component (D), a specimen was maintained at 200° C. for 10 minutes in an apparatus, then cooled down to −20° C. at a cooling rate of 10° C./min, maintained at −20° C. for 1 minute and then heated again at a heating rate of 10° C./min to obtain a DSC curve, and an endothermic peak on the DSC curve was taken as a melting point (Tm) of the component (A).

With regard to the component (B) and a graft-modified product of the component (B), a specimen having been subjected to conditioning at 23° C.±2° C. for not shorter than 72 hours was cooled down to −40° C. and heated under the conditions of a heating rate of 10° C./min to obtain a DSC curve. An endothermic peak detected on the DSC curve was taken as a melting point (Tm).

[Weight-Average Molecular Weight (Mw), Number-Average Molecular Weight (Mn) and Molecular Weight Distribution (Mw/Mn)]

Weight-average molecular weight (Mw), number-average molecular weight (Mn) and molecular weight distribution (Mw/Mn) were measured in the following manner using Alliance GPC-2000. That is to say, separation columns of TSKgel GMH6-HT×2+TSKgel GMH6-HTL×2 each having a column size of a diameter of 7.5 mm and a length of 300 mm were used. The column temperature was set to 140° C. Using orthodichlorobenzene (available from Wako Pure Chemical industries, Ltd.) as a mobile phase and using 0.025% by weight of BHT (butylhydroxytoluene) (available from Takeda Pharmaceutical Company Limited) as an antioxidant, a sample was moved at 1.0 ml/min. The sample concentration was 0.1% by weight, and the injection quantity of the sample was 500 microliters. As a detector, a differential refractometer was used. As standard polystyrene, polystyrene available from Tosoh Corporation was used.

[Interlaminar Bond Strength Between Layer (II) for Deposition and Inorganic Layer (III) (Unit: N/15 mm)]

Using a T-die extruder, a film of an ethylene/acrylic acid copolymer (EAA, available from DuPont-Mitsui Polychemicals, Co., Ltd.) having a thickness of 50 μm was produced. The resulting ethylene/acrylic acid copolymer film and an aluminum-deposited film (film having a layer for deposition and an inorganic layer (III)) having a thickness of 50 μm were bonded under pressure at 105° C. and 0.3 MPa for 10 seconds by means of a heat sealer in such a manner that the deposited surface became an adhesive surface. This laminated film was cut into a size of 15 mm (width)×80 mm (length) (film direction agreed with longitudinal direction), and using a tensile tester, a tensile test of T-type was carried out at a pulling rate of 300 mm/min, and a T-peel strength during peeling was taken as a deposition strength. In Table 1, the bond strength is referred to as aluminum deposition strength.

[Glossiness of Inorganic Layer (III) (%)]

Glossiness: Specular gloss of a gloss surface at an incident angle of 20 degrees was measured by a gloss meter (manufactured by Murakami Color Research laboratory Co., Ltd., GM-26D) in accordance with the method of JIS P 8142. In Table 1, glossiness is referred to as gloss.

(Polyolefins Used)

(1) Modified PP-1: Modified Isotactic Random Polypropylene (MFR=12 g/10 min, density=0.91 g/cm$^3$, maleic anhydride graft quantity=0.4 wt %, melting point=138° C., Mw/Mn=4.5)

(2) Modified PP-2: Modified Isotactic Homopolypropylene (MFR=10 g/10 min, density=0.90 g/cm$^3$, maleic anhydride graft quantity=0.3 wt %, Melting point=158° C., Mw/Mn=4.1)

(3) PP-1: Random Polypropylene (MFR=7 g/10 min, density=0.91 g/cm$^3$, melting point=141° C., ethylene content=3.5 mol %, Mw/Mn=7.5)

(4) PP-2: Homopolypropylene (MFR=3.0 g/10 min, density=0.91 g/cm$^3$, melting point=162° C., Mw/Mn=7.2)

(5) PER-1: Propylene/Ethylene Random Copolymer (MFR=20 g/10 min, density=0.86 g/cm$^3$, ethylene content=20 mol %, melting point=109° C., Mw/Mn=2.1)

(6) PBR-1: Propylene/Butene Random Copolymer (MFR=7 g/10 min, density=0.86 g/cm$^3$, butene content=25 mol %, melting point=75° C., Mw/Mn=2.2)

(7) PEBR-1: Propylene/Ethylene/Butene Random Copolymer (MFR=3 g/10 min, density=0.86 g/cm$^3$, ethylene content=13 mol %, butene content=19 mol %, melting point=45° C., Mw/Mn=2.0)

(8) EPR-1: Ethylene/Propylene Copolymer (MFR measured at 190° C. under a load of 2.16 kg in accordance with ASTM D1238=1 g/10 min, density=0.87 g/cm$^3$, propylene content=19 mol %, melting point=not detected)

(9) Ethylene-Based Copolymer: Ethylene/Methyl Methacrylate (MFR measured at 190° C. under a load of 2.16 kg in accordance with ASTM D1238=20 g/10 min, density=0.94 g/cm$^3$, methyl methacrylate content=20 wt %)

Example 1

Production of Composition (P) for Layer for Deposition

Using a single screw extruder, 50% by weight of modified isotactic homopolypropylene (A) (modified PP-1) and 50% by weight of a propylene/ethylene random copolymer (B) (PER-1) were melt-kneaded at 230° C. to obtain a composition (P) for a layer for deposition.

<Production of Laminate>

Layers of the following constitution were coextruded under the following conditions to produce a two-layer laminated film.

For the polyolefin-based resin layer (I), the random polypropylene (PP-1) was used. For the layer (II) for deposition, a blend of the composition (P) for a layer for deposition prepared by the above process and the polypropylene (PP-1) (weight of component (P):weight of component (PP-1)=40:60) was used. The polyolefin-based layer (I) and the layer (II) for deposition were extruded by a T-die extruder and laminated in this order in a feed block. The die temperature was 230° C. The thus coextruded laminate having a thickness of about 50 μm was cooled by a chill roll, subjected to ozone treatment and then taken off at a rate of 20 m/min. The thickness of the layer (II) for deposition/the thickness of the polyolefin-based resin layer (I) was set to 5/45 μm. The wetting index of the layer for deposition was adjusted to 42 dyn/cm by the ozone treatment.

Using a batch type aluminum deposition apparatus (Showa Vacuum SIP-600), aluminum deposition was carried out on the layer for deposition of the laminated film obtained above in such a manner that the thickness became 50 nm.

<Evaluation of Performance of Aluminum Deposition Layer>

Deposition strength of the laminate obtained in the above example and gloss of the inorganic layer (deposited surface) were measured in accordance with the aforesaid deposition strength measuring method and gloss measuring method. The results are set forth in Table 1.

Examples 2 to 8, Comparative Examples 1 to 4

Two-layer laminated films were produced in the same manner as in Example 1, except that the composition (P) for a layer for deposition or the layer (II) for deposition was prepared in accordance with the formulation shown in Table 1 or 2.

Performance of the resulting laminates is set forth in Table 1 or 2.

Comparative Example 5

Instead of the composition (P) for a layer for deposition described in Example 1, a composition was obtained by melt-kneading 60% by weight of random polypropylene (PP-1) and 40% by weight of an ethylene-based copolymer (ethylene/methyl methacrylate) at 230° C. by the use of a single screw extruder.

A two-layer laminated film was produced in the same manner as in Example 1, except that the above composition was used for the layer (II) for deposition.

Performance of the resulting laminate is set forth in Table 2.

Reference Example

Using a single screw extruder, 90% by weight of modified isotactic homopolypropylene (modified PP-1) and 10% by weight of a propylene/ethylene random copolymer (PER-1) were melt-kneaded at 230° C. to obtain a composition for a layer for deposition.

A two-layer laminated film was produced in the same manner as in Example 1, except that the above composition was used for the layer (II) for deposition.

Performance of the resulting laminate is set forth in Table 2.

The resulting laminate exhibited a deposition strength of 1.5 N/15 min, but surface roughening took place at the interface between the layer for deposition and the polyolefin-based resin layer (I), so that gloss could not be measured stably.

[Table 1]

The invention claimed is:

1. A laminate having at least a polyolefin-based resin layer (I), a layer (II) for deposition and an inorganic layer (III) in this order, wherein:
   the layer (II) for deposition comprises a composition (P) for a layer for deposition and polypropylene (D) and is different from the polyolefin-based resin layer (I),
   the composition (P) for a layer for deposition is obtained by melt-kneading 30 to 85% by weight of isotactic polypropylene (A), 70 to 15% by weight of a propylene-based copolymer (B) (with the proviso that the total of (A) and (B) is 100% by weight), and if necessary, an additive, and a part or all of the isotactic polypropylene (A) and/or the propylene-based copolymer (B) has been graft-modified with a graft monomer (C), and
   the propylene-based copolymer (B) is different from the isotactic polypropylene (A) and (i) contains 45 to 89% by mol of constituent units ($U_3$) derived from propylene and 11 to 55% by mol of constituent units ($U_0$) derived from at least one α-olefin selected from ethylene and α-olefins of 4 to 20 carbon atoms (with the proviso that the total of the constituent units ($U_3$)

TABLE 1

| | | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Composition for layer for deposition | Modified PP-1 | wt % | 50 | 70 | | 50 | | 50 | 50 | 50 |
| | Modified PP-2 | | | | 50 | | 70 | | | |
| | PP-1 | | | | | | | | | |
| | PER-1 | | 50 | 30 | | | | 50 | 50 | 50 |
| | PBR-1 | | | | 50 | | 30 | | | |
| | PEBR-1 | | | | | 50 | | | | |
| | EPR-1 | | | | | | | | | |
| Layer for deposition | Composition for layer for deposition | wt % | 40 | 40 | 40 | 40 | 40 | 90 | 10 | 40 |
| | PP-1 | | 60 | 60 | 60 | 60 | 60 | 10 | 90 | |
| | PP-2 | | | | | | | | | 60 |
| | Ethylene-based copolymer | | | | | | | | | |
| | EAA method deposition strength | N/15 mm | 1.5 | 1.2 | 1.3 | 1.3 | 0.9 | 1.6 | 0.7 | 1.2 |
| | Gloss | % | 450 | 470 | 440 | 450 | 450 | 440 | 450 | 420 |

[Table 2]

TABLE 2

| | | | Comp. Ex. 1 | Comp. Ex. 2 | Comp. Ex. 3 | Comp. Ex. 4 | Comp. Ex. 5 | Ref. Ex. |
|---|---|---|---|---|---|---|---|---|
| Composition for layer for deposition | Modified PP-1 | wt % | 100 | 90 | | 50 | | 90 |
| | Modified PP-2 | | | | | | | |
| | PP-1 | | | | 50 | | | |
| | PER-1 | | | 10 | 50 | | | 10 |
| | PBR-1 | | | | | | | |
| | PEBR-1 | | | | | | | |
| | EPR-1 | | | | | 50 | | |
| Layer for deposition | Composition for layer for deposition | wt % | 40 | 40 | 40 | 40 | | 100 |
| | PP-1 | | 60 | 60 | 60 | 60 | 60 | |
| | PP-2 | | | | | | | |
| | Ethylene-based copolymer | | | | | | 40 | |
| | EAA method deposition strength | N/15 mm | 0.3 | 0.4 | 0.3 | 1.3 | 0.9 | 1.5 |
| | Gloss | % | 450 | 450 | 440 | 220 | 55 | immeasurable | derived from propylene and the constituent units ($U_O$) derived from the α-olefin is 100% by mol).

2. The laminate as claimed in claim 1, wherein the propylene-based copolymer (B) further satisfies the following requirements (ii) and (iii):
   (ii) a melting point (Tm) as measured by a differential scanning calorimeter is not higher than 120° C. or is not observed, and
   (iii) a molecular weight distribution (Mw/Mn) as determined by gel permeation chromatography (GPC) is in the range of 1.0 to 3.0.

3. The laminate as claimed in claim 1, wherein the graft quantity of the graft monomer (C) is 0.001 to 5 parts by weight based on 100 parts of weight of the total of the isotactic polypropylene (A) and the propylene-based copolymer (B).

4. The laminate as claimed in claim 1, wherein a weight ratio between the composition (P) for a layer for deposition and the polypropylene (D) is (P):(D)=95:5 to 5:95.

5. The laminate as claimed in claim 1, wherein a part or all of at least the polypropylene (A) has been graft-modified with a graft monomer (C).

6. The laminate as claimed in claim 1, wherein the graft monomer (C) comprises an unsaturated carboxylic acid and/or its derivative.

7. The laminate as claimed in claim 1, which further has a transparent sealant layer (IV), and
   has the polyolefin-based resin layer (I), the layer (II) for deposition, the inorganic layer (III) and the transparent sealant layer (IV) in this order.

8. The laminate as claimed in claim 1, wherein the inorganic layer (III) contains aluminum.

9. A packaging material comprising the laminate as claimed in claim 1.

10. A laminate having at least a layer for deposition, wherein:
    the layer for deposition comprises a composition (P) for a layer for deposition and polypropylene (D),
    the composition (P) for a layer for deposition is obtained by melt-kneading 30 to 85% by weight of isotactic polypropylene (A), 70 to 15% by weight of a propylene-based copolymer (B) (with the proviso that the total of (A) and (B) is 100% by weight), and if necessary, an additive, and a part or all of the isotactic polypropylene (A) and/or the propylene-based copolymer (B) has been graft-modified with a graft monomer (C), and
    the propylene-based copolymer (B) is different from the isotactic polypropylene (A) and (i) contains 45 to 89% by mol of constituent units ($U_3$) derived from propylene and 11 to 55% by mol of constituent units ($U_O$) derived from at least one α-olefin selected from ethylene and α-olefins of 4 to 20 carbon atoms (with the proviso that the total of the constituent units ($U_3$) derived from propylene and the constituent units ($U_O$) derived from the α-olefin is 100% by mol).

11. A production process for a laminate having at least a layer for deposition, comprising:
    a step (1) of melt-kneading 30 to 85% by weight of isotactic polypropylene (A), 70 to 15% by weight of a propylene-based copolymer (B) (with the proviso that the total of (A) and (B) is 100% by weight), and if necessary, an additive to produce a composition (P) for a layer for deposition, and
    a step (2) of producing a layer for deposition comprising the composition (P) for a layer for deposition and polypropylene (D),
    wherein a part or all of the isotactic polypropylene (A) and/or the propylene-based copolymer (B) has been graft-modified with a graft monomer (C), and
    the propylene-based copolymer (B) is different from the isotactic polypropylene (A) and (i) contains 45 to 89% by mol of constituent units ($U_3$) derived from propylene and 11 to 55% by mol of constituent units ($U_O$) derived from at least one α-olefin selected from ethylene and α-olefins of 4 to 20 carbon atoms (with the proviso that the total of the constituent units ($U_3$) derived from propylene and the constituent units ($U_O$) derived from the α-olefin is 100% by mol).

\* \* \* \* \*